United States Patent
Chen et al.

(10) Patent No.: US 10,528,090 B2
(45) Date of Patent: Jan. 7, 2020

(54) HINGE ASSEMBLY FOR A COMPUTING DEVICE

(71) Applicant: HEWLETT-PACKARD DEVELOPMENT COMPANY, L.P., Houston, TX (US)

(72) Inventors: Roger Chen, Taipei (TW); Kt Wu, Taipei (TW); Charlie Ku, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 15/563,980

(22) PCT Filed: Jun. 19, 2015

(86) PCT No.: PCT/US2015/036586
§ 371 (c)(1),
(2) Date: Oct. 3, 2017

(87) PCT Pub. No.: WO2016/204776
PCT Pub. Date: Dec. 22, 2016

(65) Prior Publication Data
US 2018/0136699 A1 May 17, 2018

(51) Int. Cl.
*E05D 3/12* (2006.01)
*H05K 5/02* (2006.01)
(Continued)

(52) U.S. Cl.
CPC .......... *G06F 1/1681* (2013.01); *E05D 3/122* (2013.01); *E05D 7/00* (2013.01); *E05D 11/082* (2013.01);
(Continued)

(58) Field of Classification Search
None
See application file for complete search history.

(56) References Cited

U.S. PATENT DOCUMENTS 5,721,669 A * 2/1998 Becker ................. G11B 33/124
361/679.31
6,952,861 B2 * 10/2005 Ynosencio ................ E05D 3/12
16/225
(Continued)

FOREIGN PATENT DOCUMENTS

| CN | 201771947 | 3/2011 |
| CN | 103453007 | 12/2013 |

(Continued)

OTHER PUBLICATIONS

Marco Chiappetta, "HP Spectre X360 Ultrabook Review: Sleek, Sexy, Convertible," Mar. 1, 2015, pp. 1-7, Hardware.com.

*Primary Examiner* — Xanthia C Cunningham
(74) *Attorney, Agent, or Firm* — HPI Patent Department

(57) ABSTRACT

Examples disclosed herein provide a hinge assembly for a computing device. One example hinge assembly includes a first bracket attached to a first member of the computing device and a second bracket attached to a second member of the computing device. The hinge assembly includes a hinge pivotally connecting the first bracket to the second bracket along a first axis, and a first gear rotatably connected to the first bracket along the first axis. The hinge assembly further includes a set of gears, each gear from the set of gears rotatably connected to different axes parallel to the first axis. As an example, the set of gears is to provide friction against the first gear to provide a level of resistance to a torque provided when the first bracket is to be moved along the first axis.

13 Claims, 4 Drawing Sheets

(51) Int. Cl.
*G06F 1/16* (2006.01)
*E05D 7/00* (2006.01)
*E05D 11/08* (2006.01)
*F16C 11/04* (2006.01)
*F16M 13/00* (2006.01)

(52) U.S. Cl.
CPC .......... *F16C 11/04* (2013.01); *F16M 13/005* (2013.01); *G06F 1/1616* (2013.01); *H05K 5/0234* (2013.01); *E05Y 2900/606* (2013.01)

(56) References Cited

U.S. PATENT DOCUMENTS

| | | | |
|---|---|---|---|
| 7,311,366 B2 | 12/2007 | Kim et al. | |
| 7,640,044 B2 | 12/2009 | Won et al. | |
| 7,898,801 B2* | 3/2011 | Wang | H04M 1/04 248/168 |
| 8,186,781 B2* | 5/2012 | Coleman | E05D 3/022 16/354 |
| 8,231,099 B2* | 7/2012 | Chen | F16M 11/10 248/461 |
| 8,250,711 B1* | 8/2012 | Chen | E05D 7/081 16/239 |
| 8,411,427 B2* | 4/2013 | Jeong | H04M 1/0216 361/679.26 |
| 8,769,772 B2* | 7/2014 | Griffin | H04M 1/0216 16/354 |
| 8,833,190 B2* | 9/2014 | Hsu | G06F 1/1624 379/433.12 |
| 8,922,995 B2* | 12/2014 | Su | F16M 11/10 248/917 |
| 8,938,855 B2 | 1/2015 | Ahn et al. | |
| 8,971,031 B2 | 3/2015 | Mok et al. | |
| 9,027,205 B2 | 5/2015 | Ahn et al. | |
| 9,036,347 B2* | 5/2015 | Kuo | F16M 11/10 361/679.59 |
| 9,329,639 B2* | 5/2016 | Lee | G06F 1/1669 |
| 9,436,229 B2* | 9/2016 | Yoo | G06F 1/1637 |
| 9,462,719 B2* | 10/2016 | Wu | H05K 7/1409 |
| 9,528,308 B2* | 12/2016 | Cho | E05D 3/122 |
| 9,671,830 B2* | 6/2017 | Chen | F16M 13/005 |
| 9,904,315 B2* | 2/2018 | Zhang | G06F 1/1618 |
| 2002/0038493 A1* | 4/2002 | Ko | H04N 5/2251 16/303 |
| 2005/0122671 A1 | 6/2005 | Homer | |
| 2009/0070961 A1 | 3/2009 | Chung et al. | |
| 2010/0232100 A1* | 9/2010 | Fukuma | F16G 13/18 361/679.01 |
| 2011/0000136 A1* | 1/2011 | Brun | E05D 3/06 49/358 |
| 2012/0096678 A1* | 4/2012 | Zhang | G06F 1/1681 16/302 |
| 2012/0218691 A1* | 8/2012 | Minemura | G06F 1/1616 361/679.01 |
| 2012/0218699 A1* | 8/2012 | Leung | G06F 1/1616 361/679.08 |
| 2012/0314980 A1* | 12/2012 | Chen | H04M 1/0237 384/26 |
| 2013/0139355 A1 | 6/2013 | Lee et al. | |
| 2013/0187525 A1* | 7/2013 | Chuang | G06F 1/1681 312/326 |
| 2014/0217875 A1* | 8/2014 | Park | H05K 5/0226 312/326 |
| 2014/0245569 A1* | 9/2014 | Cho | E05D 3/122 16/370 |
| 2014/0347814 A1 | 11/2014 | Zaloom | |
| 2014/0360296 A1 | 12/2014 | Hsu | |
| 2015/0070858 A1* | 3/2015 | Wu | H05K 7/1409 361/754 |
| 2015/0146362 A1* | 5/2015 | Meyers | E05D 3/122 361/679.27 |
| 2015/0176317 A1* | 6/2015 | Lee | E05D 3/06 16/251 |
| 2015/0267450 A1* | 9/2015 | Chiang | G06F 1/1681 16/354 |
| 2015/0362956 A1* | 12/2015 | Tazbaz | G06F 1/1637 361/679.27 |

FOREIGN PATENT DOCUMENTS

| | | |
|---|---|---|
| CN | 104019120 | 9/2014 |
| TW | M391012 | 10/2010 |
| TW | M392529 | 11/2010 |
| TW | M489458 | 11/2014 |

* cited by examiner

HINGE ASSEMBLY FOR A COMPUTING DEVICE

BACKGROUND

The emergence and popularity of computing has made computing devices a staple in today's marketplace. An example of such devices include notebook computers, or laptops, which generally employ a clamshell-type design consisting of two members connected together at a common end via one or more hinges, for example. In most cases, a first or display member is utilized to provide a viewable display to a user while a second or base member includes an area for user input (e.g., touchpad and keyboard). In addition, the viewable display may be a touchscreen (e.g., touchscreen laptop), allowing the user to interact directly with what is displayed by touching the screen with simple or multi-touch gestures. Other examples of popular computing devices include tablet computers and all-in-one (AIO) computers, which integrate internal components of the computer into the same case as the display. As an example, such devices may include a support member, or a kickstand, for supporting the devices at multiple viewing angles when they are operated in one of their various modes.

DETAILED DESCRIPTION

When a user operates a computing device in its various modes, it is desirable for the computing device to feel sturdy and rigid. For example, when the user operates a laptop by setting the display member at an appropriate viewing angle, it is not desirable for the display member to fall forwards or backwards as the user operates the laptop. Similarly, with respect to tablet computer or an AIO computer supported by a kickstand, it is desirable for the kickstand to be able to support such computing devices at multiple viewing angles when the computing devices are operated in one of their various modes.

Examples disclosed herein provide a hinge assembly for a computing device that allows the computing device to feel sturdy and rigid during operation. As will be further described, the hinge assembly includes a number of gears along parallel axes, that work together to provide a level of rigidity that is desirable by users. By utilizing the gears along the parallel axes, the width of the hinge assembly may be reduced, allowing the hinge assembly to be fitted in a narrow area of the computing device.

Figure 1B:
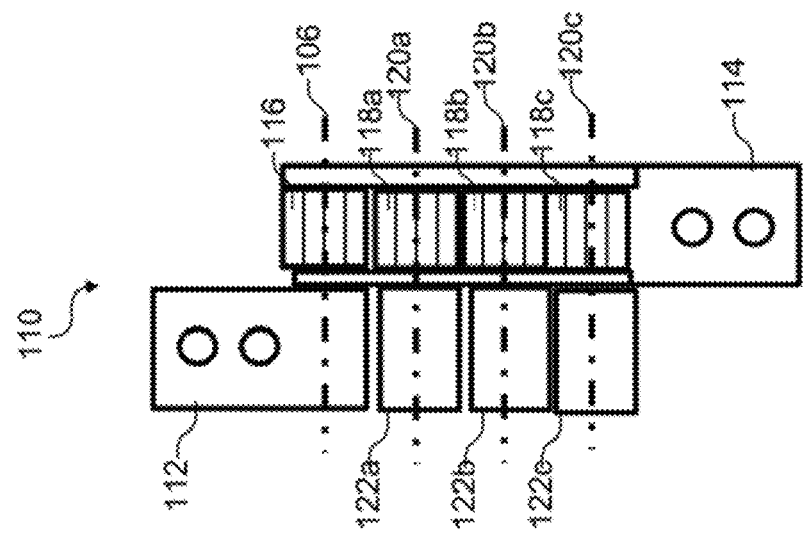
FIG. 1B illustrates a hinge assembly that may b used in the computing device illustrated in FIG. 1A, according to an example.
Figure 1A:
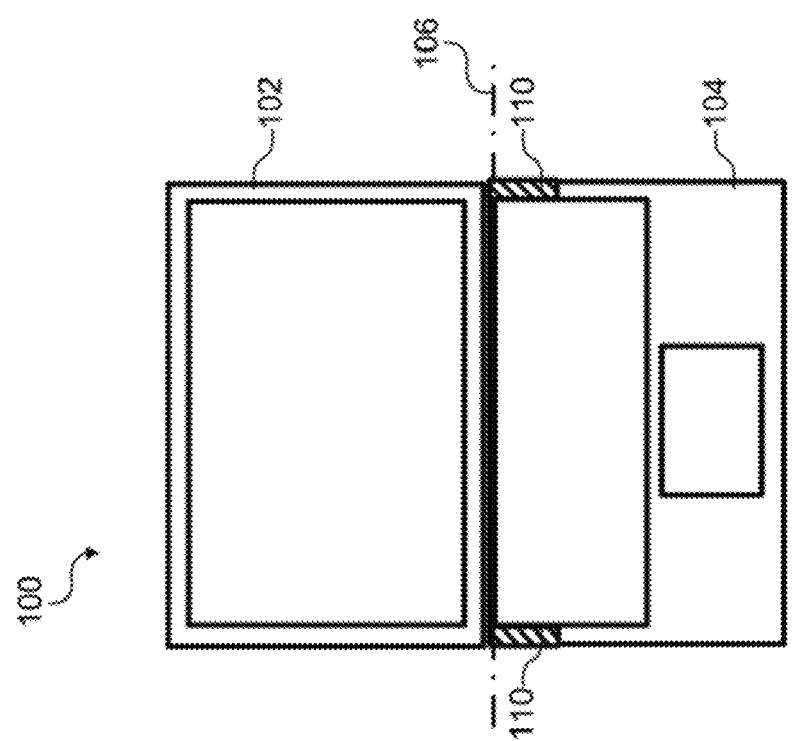
FIG. 1A illustrates a computing device, according to an example.

With reference to the figures, FIG. 1A illustrates a computing device 100, according to an example. The computing device 100 includes a display member 102 and a base member 104 that are joined together via hinge assemblies 110. The display member 102 may be rotatably connected to the base member 104 via a shaft around an axis of rotation 106. As an example, the base member 104 includes a top surface that may include input means for operation by a user, such as a keyboard and/or a touchpad. The display member 102 includes a display surface that may be used for viewing the video output of the computing device 100, and may include input means for operation by a user, such as a touchscreen. Referring to the hinge assemblies 110 illustrated, the width or X dimension of the hinge assemblies 110 may be small enough to fit within a narrow enclosure within the base member 104. As a result, by reducing spacing required by the hinge assemblies 110, dimensions of the computing device 100, such as the thickness, may also be reduced.

FIG. 1 illustrates an example of the hinge assembly 110 that may be used in the computing device 100. The hinge assembly 110 includes a first bracket 112 to attach to a first member of the computing device 100, such as the display member 102. In addition, the hinge assembly 110 includes a second bracket 114 to attach to a second member of the computing device 100, such as the base member 104. Via the hinge assemblies 110, the display member 102 may be rotatably connected to the base member 104 via a shaft around the axis of rotation 106. Referring back to FIG. 1A, although two hinge assemblies 110 are illustrated for joining together the display member 102 and base member 104, any number of hinge assemblies may be utilized. As will be further described, by using an arrangement of gears within the hinge assemblies 110, the width of a hinge assembly 110 may be minimized.

As illustrated, the hinge assembly 110 includes a first gear 116 rotatably connected to the first bracket 112 along the axis of rotation 106. Moreover, the hinge assembly 110 includes a set of gears 118a-c that is synchronized to rotate with the first gear 116 when the first bracket 112 is to be moved along the axis of rotation 106, such as when the display member 102 is opened or closed. As will be further described, each gear from the set of gears 118a-c may be rotatably connected to different axes 120a-c, respectively, such that the set of gears 118a-c provides friction against the first gear 116 in order to provide a level of resistance to a torque provided when the first bracket 112 is to be moved along the axis of rotation 106. As illustrated, the axes 120a-c are parallel to the axis of rotation 106. Although three gears are illustrated in the set of gears 118a-c, any number of gears may be utilized. For example, the quantity of gears in the set of gears determines the magnitude of friction provided by the set of gears against the first gear 116. As a result, increasing the quantity of gears in the set of gears may increase the magnitude of the friction provided by the set of gears against the first gear 116.

As an example for providing friction against the first gear 116, for each gear from the set of gears 118a-c, a pivot point of the gear around a respective axis from the different axes 120a-c parallel to the axis of rotation 106 may have a frictional value to provide a level of resistance of the rotation of the gear around the respective axis. For example, referring to gear 118a from the set of gears, a pivot point of the gear 118a around axis 120a has a frictional value to provide a level of resistance of the rotation of the gear 118a around the axis 120a. Collectively, the frictional value from set of gears 118a-c may provide friction against the first gear 116 to provide a level of resistance to a torque provided when the first bracket 112 is to be moved along the axis of rotation 106 (e.g., when the display member 102 is opened or closed). As mentioned above, increasing the number of gears in the set of gears collectively increases the magnitude of the friction provided by the set of, gears against the first gear 118.

Referring to FIG. 1B, each gear from the set of gears 118a-c may be coupled to an element 122a-c, respectively, that provides the level of resistance of the rotation of each gear around the respective axis (axes 120a-c). Examples of the elements 122a-c include, but are not limited to, friction hinges, clutches, washers, or bands. As an example, the elements 122a-c may provide friction for providing a level of resistance of the rotation of each gear from the set of gears 118a-c.

Figure 2A:
FIGS. 2A-D illustrate further aspects of the hinge assembly according to an example.
Figure 2B:
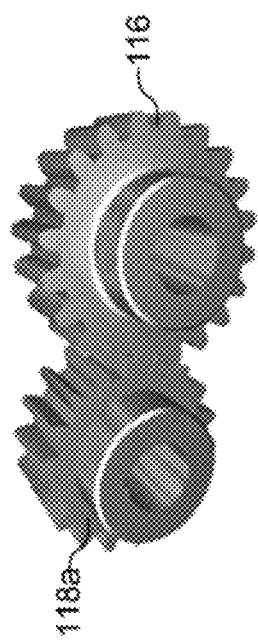

FIGS. 2A-D illustrate further aspects of the hinge assembly 110, according to an example. Referring to FIG. 2A, the first gear 116 generally includes teeth to mesh with teeth in gear 118a from the set of gears 118a-c. Similarly, the teeth of gear 118a meshes with teeth in gear 118b and the teeth in gear 118b meshes with teeth in gear 118c (not illustrated). As a result, the set of gears 118a-c is synchronized to rotate with the first gear 116 when the first bracket 112 is to be moved along the axis of rotation 106 (e.g., when the display member 102 is to be open and closed). The type of gears that are used may vary. For example referring to FIG. 2B, helical gears may be used.

Figure 2C:
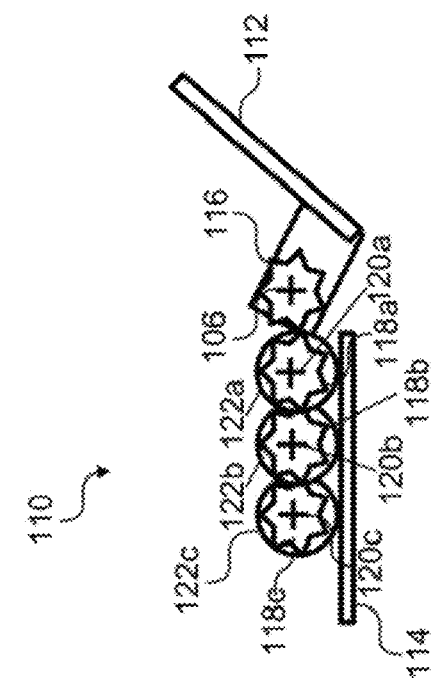
Figure 2D:
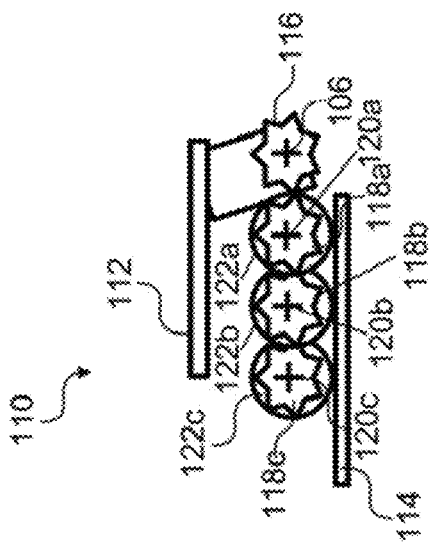

FIGS. 2C-D illustrate the opening and closing of the hinge assembly 110 and the synchronization of the gears within the hinge assembly 110, according to an example. As illustrated, the teeth of the first gear 116 meshes with the teeth of gear 118a, which then meshes with the teeth of gear 118b, which finally meshes with the teeth of gear 118c. As described above, elements 122a-c provide the level of resistance of the rotation of each gear from the set of gears 118a-c around the respective axes 120a-c. As a result, the set of gears 118a-c provides friction against the first gear 116 in order to provide a level of resistance to a torque provided when the first bracket 112 is to be moved along the axis of rotation 106 (e.g., when the display member 102 is to be open and closed). As an example, in order to increase or reduce the friction provided against the first gear 116 (e.g., torque adjustment), the quantity of gears used in the set of gears may be increased or decreased, respectively.

Figure 3B:
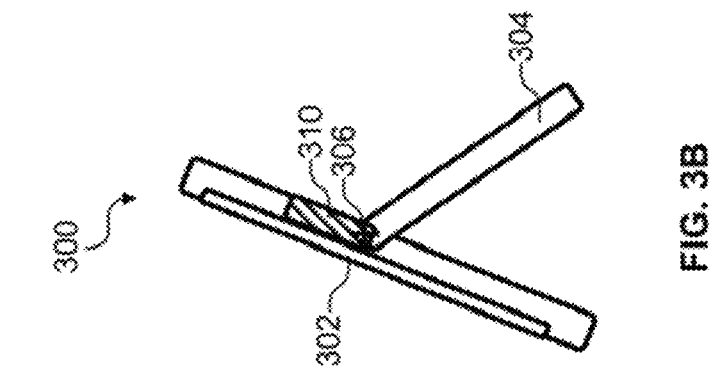
FIGS. 3A-B illustrate a computing device with a kickstand for supporting the computing device at multiple viewing angles when the computing device is operated in one of its various modes, according to an example.
Figure 3A:
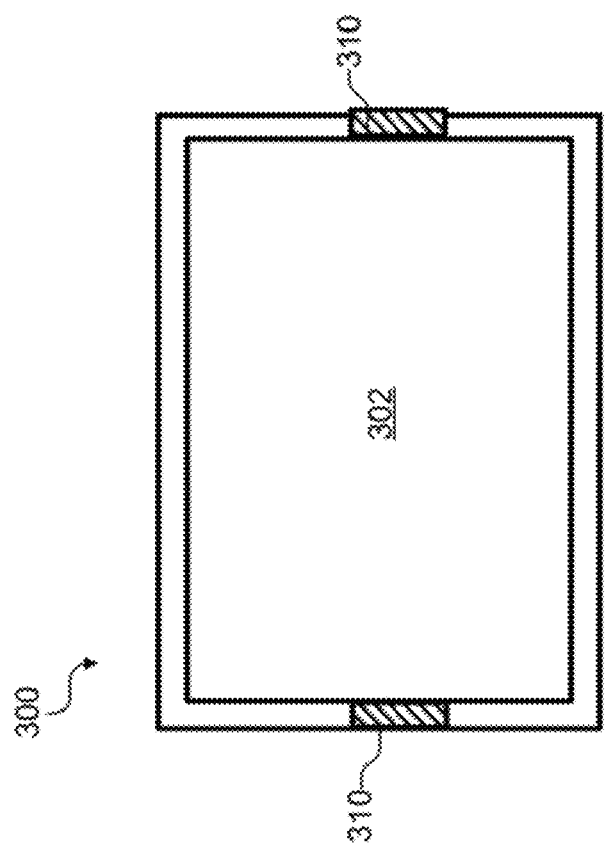

FIGS. 3A-B illustrate a computing device 300 with a kickstand 304 or support member for supporting the computing device 300 multiple viewing angles when the computing device is operated in one of its various modes, according to an example. Examples of the computing device 300 include, but are not limited to, a smartphone, a tablet, AIO computer, or a display member of a convertible laptop. The computing device 300 may include a display surface 302. The display surface 302 may be a touchscreen, allowing a user to interact directly with what is displayed by touching the screen with simple or multi-touch gestures.

As an example, the kickstand 304 may be a rectangular frame that flips out or pivots from a portion of a perimeter of the computing device 300 and makes contact with a surface in various positions for propping up the computing device 300 at the various vie in angles. As a result, the computing device 300 may be kept upright via the kickstand 304 without leaning the computing device 300 against another object or with the aid of a user. As illustrated, the kickstand 304 is rotatably connected to the computing device 300 around an axis of rotation 306, and joined with the computing device 300 via the use of hinge assemblies 310. As an example, the width or X dimension of the hinge assemblies 310 may be small enough to fit within a narrow enclosure within the computing device 300, for example, outside the surface area of the display surface 302.

Figure 3C:
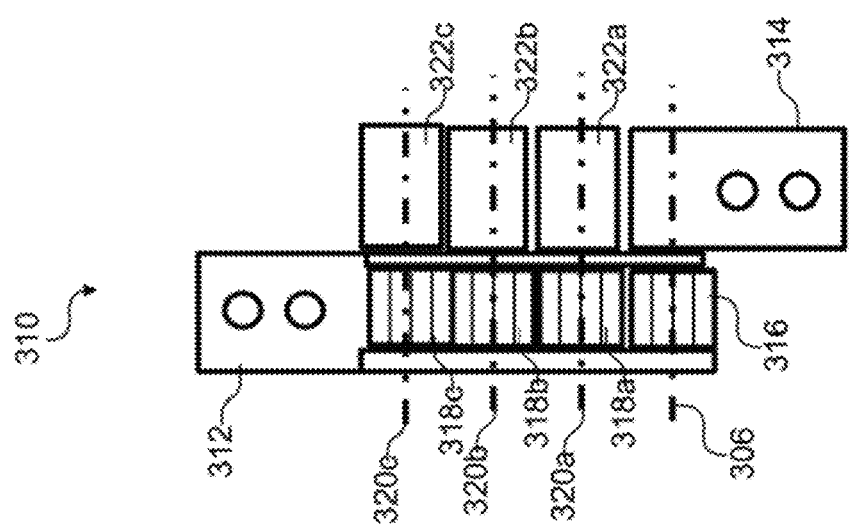
FIG. 3C illustrates a hinge assembly that may be used in the computing device illustrated in FIGS. 3A-B, according to an example.

FIG. 3C illustrates an example of the hinge assembly 310 that may be used in the computing device 300. The hinge assembly 310 includes a first bracket 312 to attach to a first member of the computing device 300, such as the computing device 300 itself. In addition, the hinge assembly 310 includes second bracket 314 to attach to a second member of the computing device 300, such as the kickstand 304. Via the hinge assemblies 310, the computing device 300 may be rotatably connected to the kickstand 304 via a shaft around the axis of rotation 306. Referring back to FIG. 3A, although two hinge assemblies 310 are illustrated for joining together the kickstand 304 to the computing device 300, any number of hinge assemblies may be utilized. As will be further described, by using an arrangement of gears within the hinge assemblies 310, the width of a hinge assembly 310 may be minimized.

As illustrated, the hinge assembly 310 includes a first gear 316 rotatably connected to the first bracket 312 along the axis of rotation 306. Moreover, the hinge assembly 310 includes a set of gears 318a-c that is synchronized to rotate with the first gear 316 when the second bracket 314 is to be moved along the axis of rotation 306, such as when the kickstand 304 is adjusted. As will be further described, each gear from the set of gears 318a-c may be rotatably connected to different axes 320a-c, respectively, such that the set of gears 318a-c provides friction against the first gear 316 in order to provide a level of resistance to a torque provided when the second bracket 314 is to be moved along the axis of rotation 306. As illustrated, the axes 320a-c are parallel to the axis of rotation 306. Although three gears are illustrated in the set of gears 318a-c, any number of gears may be utilized. For example, the quantity of gears in the set of gears determines the magnitude of friction provided by the set of gears against the first gear 316. As a result, increasing the quantity of gears in the set of gears may increase the magnitude of the friction provided by the set of gears against the first gear 316.

As an example for providing friction against the first gear 316, for each gear from the set of gears 318a-c, a pivot point of the gear around a respective axis from the different axes 320a-c parallel to the axis of rotation 306 may have a frictional value to provide a level of resistance of the rotation of the gear around the respective axis. For example, referring to gear 318a from the set of gears, a pivot point of the gear 318a around axis 320a has a frictional value to provide a level of resistance of the rotation of the gear 318a around the axis 320a. Collectively, the frictional value from set of gears 318a-c may provide friction against the first gear 316 to provide a level of resistance to a torque provided when the second bracket 314 is to be moved along the axis of rotation 306 (e.g., when the kickstand 304 is adjusted). As mentioned above, increasing the number of gears in the set of gears collectively increases the magnitude of the friction provided by the set of gears against the first gear 316.

Referring to FIG. 3C, each gear from the set of gears 318a-c may be coupled to an element 322a-c, respectively, that provides the level of resistance of the rotation of each gear and the respective axis (axes 320a-c). Examples of the elements 322a-c include, but are not limited to, friction hinges, clutches, washers, or bands. As an example, the elements 322a-c may provide friction for providing a level of resistance of the rotation of each gear from the set of gears 318a-c.

Figure 4:
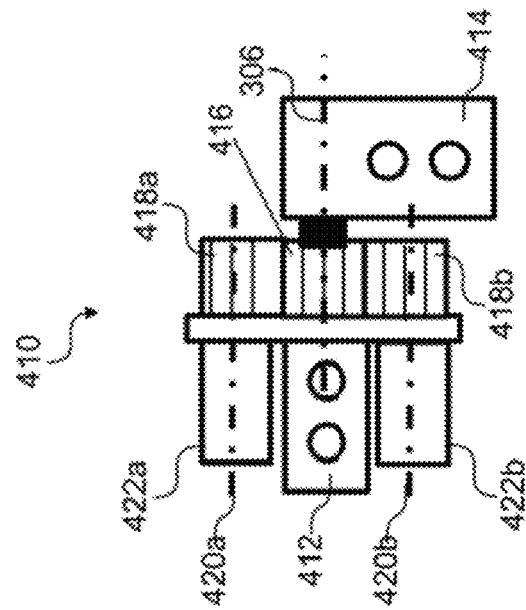
FIG. 4 illustrates another hinge assembly that may be used in the computing device illustrated in FIGS. 3A-B, according to an example.

FIG. 4 illustrates an example of another hinge assembly 410 that may be used in joining the kickstand 304 to the computing device 300. The hinge assembly 410 includes a first bracket 412 to attach to a first member of the computing device 300, such as the computing device 300 itself. In addition, the hinge assembly 410 includes a second bracket 414 to attach to a second member of the computing device 300, such as the kickstand 304. Via the hinge assemblies 410, the computing device 300 may be rotatably connected to the kickstand 304 via a shaft around the axis of rotation 306. As will be further described, by using an arrangement of gears within the hinge assemblies 410, the width of a hinge assembly 410 may be minimized, for example, to fit within a narrow enclosure along a perimeter of the computing device 300.

As illustrated, the hinge assembly 410 includes a first gear 416 rotatably connected to the first bracket 412 along the axis of rotation 306. Moreover, the hinge assembly 410 includes a set of gears 418a-b that is synchronized to route with the first gear 416 when the second bracket 414 is to be moved along the axis of rotation 306, such as when the kickstand 304 is adjusted. As illustrated, the first gear 416 may be disposed between gear 418a and gear 418b. As will be further described, each gear from the set of gears 418a-b may be rotatably connected to different axes 420a-b, respectively, such that the set of gears 418a-b provides friction against the first gear 416 in order to provide a level of resistance to a torque provided when the second bracket 414 is to be moved along the axis of rotation 306. As illustrated the axes 420a-b are parallel to the axis of rotation 306.

As an example for providing friction against the first gear 416, for each gear from the set of gears 418a-b, a pivot point of the gear around a respective axis from the different axes 420a-b parallel to the axis of rotation 306 may have a frictional value to provide a level of resistance of the rotation of the gear around the respective axis. For example, referring to gear 418a from the set of gears, a pivot point of the gear 418a around axis 420a has a frictional value to provide a level of resistance of the rotation of the gear 418a around the axis 420a. Collectively, the frictional value from set of gears 418a-b may provide friction against the first gear 416 to provide a level of resistance to a torque provided when the second bracket 414 is to be moved along the axis of rotation 306 (e.g., when the kickstand 304 is adjusted).

Referring to FIG. 4, each gear from the set of gears 418a-b may be coupled to an element 422a-b, respectively, that provides the level of resistance of the rotation of each gear around the respective axis (axes 420a-b). Examples of the elements 422a-b include, but are not limited to, friction hinges, clutches, washers, or bands. As an example, the elements 422a-b may provide friction for providing a level of resistance of the rotation of each gear from the set of gears 418a-b.

It should be understood that examples described herein below may include various components and features. It should also be understood that, in the following description, numerous specific details are set forth to provide a thorough understanding of the examples. However, it should be understood that the examples may be practiced without limitations to these specific details. In some instances, well known methods and structures may not be described in detail to avoid unnecessarily obscuring the description of the examples. Also, the examples may be used in combination with each other.

Reference in the specification to "an example" or similar language means that a particular feature, structure, or characteristic described in connection with the example is included in at least one example, but not necessarily in other examples. The various instances of the phrase "in one example" or similar phrases in various places in the specification are not necessarily all referring to the same example.

It should be understood that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:

1. A hinge assembly for a computing device, the hinge assembly comprising:
   a first bracket to be attached to a first member of the computing device;
   a second bracket to be attached to a second member of the computing device;
   a hinge coupled to the first bracket and the second bracket, wherein the first bracket is to pivot relative to the second bracket about a first axis via the hinge;
   a first gear rotatably connected to the first bracket, wherein the first gear is to rotate about the first axis when the first bracket pivots relative to the second bracket about the first axis; and
   a set of gears, each gear from the set of gears rotatably aligned with different axes that are parallel to the first axis, wherein the set of gears are rotatably coupled to the first gear such that rotation of the first gear about the first axis is to cause a corresponding rotation of the set of gears about the different axes, wherein the set of gears is to provide friction against the first gear to provide a level of resistance to a torque provided when the first bracket is to be pivoted about the first axis relative to the second bracket.

2. The hinge assembly of claim 1, wherein a quantity of gears in the set of gears is to determined a magnitude of the friction provided by the set of gears against the first gear.

3. The hinge assembly of claim 2, wherein increasing the quantity of the gears in the set of gears is to increase the magnitude of the friction provided by the set of gears against the first gear.

4. The hinge assembly of claim 1, wherein, for each gear from the set of gears, a pivot point of the gear around a respective axis from the different axes parallel to the first axis has a frictional value to provide a level of resistance of the rotation of the gear around the respective axis.

5. The hinge assembly of claim 4, wherein, for each gear from the set of gears, the frictional value of the pivot point of the gear around the respective axis from the different axes parallel to the first axis is provided by an element comprising friction hinges, clutches, washers, and bands.

6. The hinge assembly of claim 1, wherein the first gear comprises teeth to mesh with teeth in a second gear from the set of gears in order to synchronize the rotation of the set of gears with the first gear.

7. A computing device comprising:
   a display member;
   a base member rotatably connected to the display member around an axis of rotation; and
   a hinge assembly to join the display member to the base member, the hinge assembly comprising:
   a first bracket attached to the display member;

a second bracket attached to the base member;
a hinge pivotally coupled to the first bracket and the second bracket, wherein the display member is to pivot relative to the base member about the axis of rotation via the hinge;
a first gear rotatably connected to the first bracket, wherein the first gear is to rotate about the axis of rotation when the display member pivots relative to the base member about the axis of rotation; and
a set of gears, each gear from the set of gears rotatably aligned with different axes that are parallel to the axis of rotation, wherein the set of gears are rotatably coupled to the first gear such that rotation of the first gear about the axis of rotation is to cause a corresponding rotation of the set of gears about the different axes, wherein the set of gears is to provide friction against the first gear to provide a level of resistance to a torque provided when the display member is to be pivoted about the axis of rotation relative to the base member.

8. The computing device of claim 7, wherein a quantity of gears in the set of gears is to determine a magnitude of the friction provided by the set of gears against the first gear.

9. The computing device of claim 8, wherein increasing the quantity of the gears in the set of gears is to increase the magnitude of the friction provided by the set of gears against the first gear.

10. The computing device of claim 7, wherein, for each gear from the set of gears, a pivot point of the gear around a respective axis from the different axes parallel to the axis of rotation has a frictional value to provide a level of resistance of the rotation of the gear around the respective axis.

11. A computing device comprising:
a display member;
a kickstand rotatably connected to the display member around an axis of rotation, wherein the kickstand is to support the display member in a plurality of viewing angles; and
a hinge assembly to join the kickstand to the display member, the hinge assembly comprising:
a first bracket attached to the kickstand;
a second bracket attached to the display member;
a hinge pivotally coupled to the first bracket and the second member about the axis of rotation via the hinge;
a first gear rotatably connected to the first bracket, wherein the first gear is to rotate about the axis of rotation when the kickstand pivots relative to the display member about the axis of rotation; and
a set of gears, each gear from the set of gears rotatably aligned with different axes that are parallel to the axis of rotation, wherein the set of gears are rotatably coupled to the first gear such that rotation of the first gear about the axis of rotation is to cause a corresponding rotation of the set of gears about the different axes, wherein the set of gears is to provide friction against the first gear to provide a level of resistance to a torque provided when the kickstand is to be pivoted about the axis of rotation relative to the display member.

12. The computing device of claim 11, wherein a quantity of gears in the set of gears is to determine a magnitude of the friction provided by the set of gears against the first gear.

13. The computing device of claim 11, wherein, for each gear from the set of gears, a pivot point of the gear around a respective axis from the different axes parallel to the axis of rotation has a frictional value to provide a level of resistance of the rotation of the gear around the respective axis.

* * * * *